United States Patent
Wu et al.

(10) Patent No.: US 10,743,661 B1
(45) Date of Patent: Aug. 18, 2020

(54) SLIDE RAIL MECHANISM

(71) Applicant: HONGFUJIN PRECISION ELECTRONICS(TIANJIN)CO., LTD., Tianjin (CN)

(72) Inventors: Chang-Ju Wu, New Taipei (TW); Chen-Sheng Tang, New Taipei (TW)

(73) Assignee: HONGFUJIN PRECISION ELECTRONICS(TIANJIN)CO., LTD., Tianjin (CN)

( * ) Notice: Subject to any disclaimer, the term of this patent is extended or adjusted under 35 U.S.C. 154(b) by 0 days.

(21) Appl. No.: 16/541,294

(22) Filed: Aug. 15, 2019

(30) Foreign Application Priority Data

Jun. 26, 2019 (CN) .......................... 2019 1 0563739

(51) Int. Cl.
*A47B 88/00* (2017.01)
*A47B 88/483* (2017.01)
*A47B 88/43* (2017.01)
*A47B 96/06* (2006.01)

(52) U.S. Cl.
CPC ............ *A47B 88/483* (2017.01); *A47B 88/43* (2017.01); *A47B 96/06* (2013.01)

(58) Field of Classification Search
CPC .... H05K 7/1489; H05K 7/183; A47B 88/423; A47B 88/43
USPC ...................................................... 312/334.5
See application file for complete search history.

(56) References Cited

U.S. PATENT DOCUMENTS

| 3,092,429 | A | * | 6/1963 | Barnes | A47B 88/49 312/333 |
| 6,834,923 | B2 | * | 12/2004 | Young | A47B 88/483 312/334.8 |
| 2005/0212390 | A1 | * | 9/2005 | Silvestro | A47B 88/43 312/334.4 |
| 2012/0257845 | A1 | * | 10/2012 | Fan | H05K 7/1489 384/35 |
| 2017/0095078 | A1 | * | 4/2017 | Chen | H05K 7/1489 |
| 2017/0095079 | A1 | * | 4/2017 | Chen | H05K 7/1489 |

FOREIGN PATENT DOCUMENTS

TW    I649046    2/2019

* cited by examiner

*Primary Examiner* — Matthew W Ing
(74) *Attorney, Agent, or Firm* — ScienBiziP, P.C.

(57) ABSTRACT

A slide rail mechanism includes a first bracket and a second bracket. The first bracket is slidably coupled to the second bracket. The second bracket includes a second body and two second bent portions respectively extending toward each other from two longitudinal sides of the second body. A gap is defined between each second bent portion and the second body. The first bracket is slidably received in the gaps. The second bent portions limit a sliding direction of the first bracket relative to the second bracket. The first bracket is retracted or extended relative to the second bracket to adjust a combined length of the first bracket and the second bracket in a cabinet.

12 Claims, 5 Drawing Sheets

SLIDE RAIL MECHANISM

FIELD

The subject matter herein generally relates to slide rail mechanisms, and more particularly to a slide rail mechanism able to be adjusted to fit cabinets of different sizes.

BACKGROUND

Generally, a slide rail mechanism in a server cabinet fits a rail mechanism of a certain size. If a server in the server cabinet needs to be moved into a cabinet of a different size, the rail mechanism needs to be replaced. Such a configuration of slide rail may increase costs.

BRIEF DESCRIPTION OF THE DRAWINGS

Implementations of the present disclosure will now be described, by way of embodiments, with reference to the attached figures.

DETAILED DESCRIPTION

Figure 1:
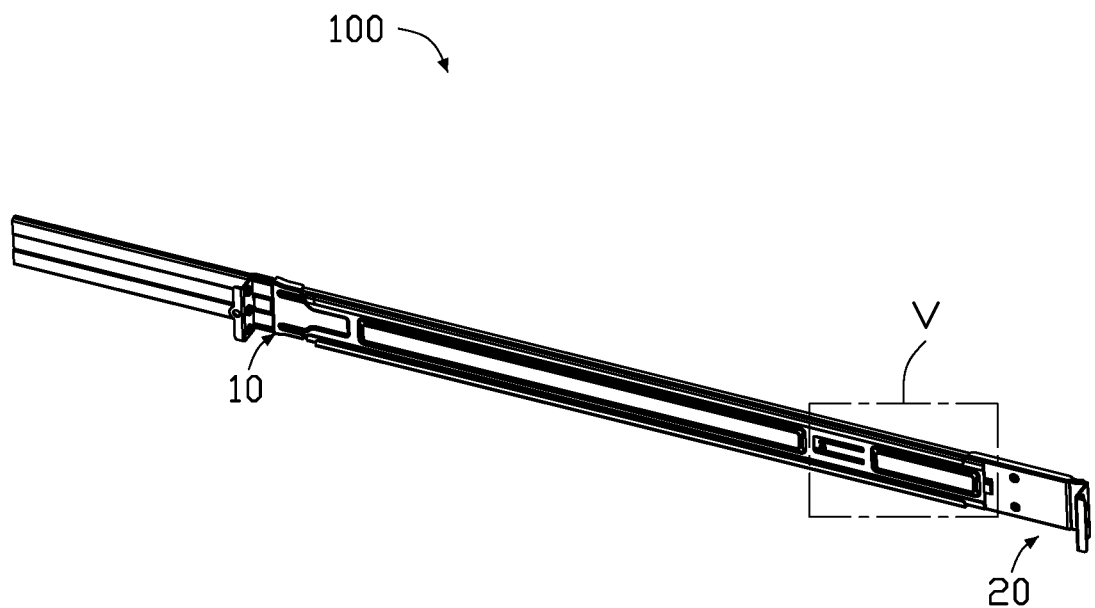
FIG. 1 is an assembled, isometric view of an embodiment of a slide rail mechanism.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other word that "substantially" modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series and the like.

FIG. 1 shows an embodiment of a slide rail mechanism 100. The slide rail mechanism 100 can extend and retract to be mounted in cabinets of different specifications.

Figure 2:
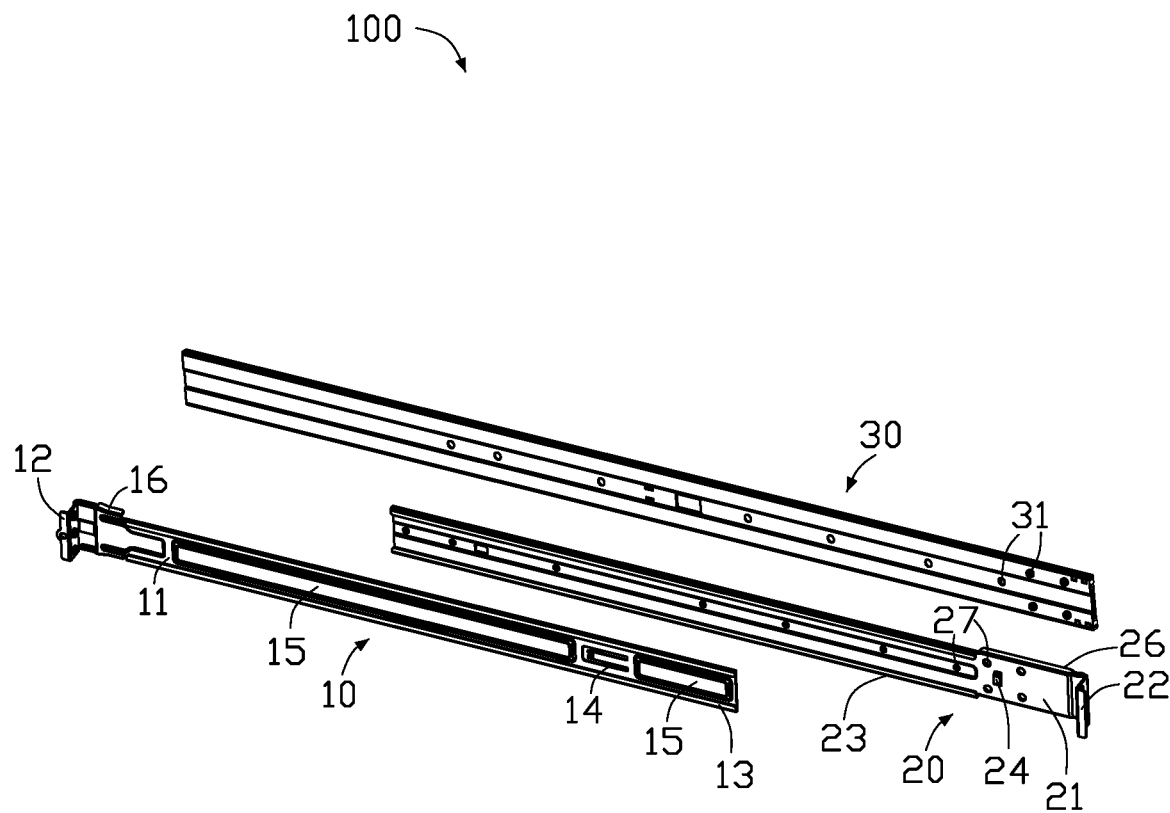
FIG. 2 is an exploded, isometric view of the slide rail mechanism in FIG. 1.

As shown in FIG. 1 and FIG. 2, the slide rail mechanism 100 includes a first bracket 10 and a second bracket 20. The first bracket 10 and the second bracket 20 are configured to be mounted on a cabinet (not shown), and the first bracket 10 is slidably coupled to the second bracket 20. The first bracket 10 includes a first fixing portion 12 and first bent portions 13. The second bracket 20 includes a second fixing portion 22 and second bent portions 23. A gap 231 (shown in FIG. 4) is defined by each second bent portion 23, and the first bent portions 13 are respectively received in the gaps 231 to slidably couple the first bracket 10 to the second bracket 20. The second bent portions 23 limit a sliding direction of the first bracket 10 and support the first bracket 10. The first fixing portion 12 and the second fixing portion 22 are fixed to the cabinet.

Figure 3:
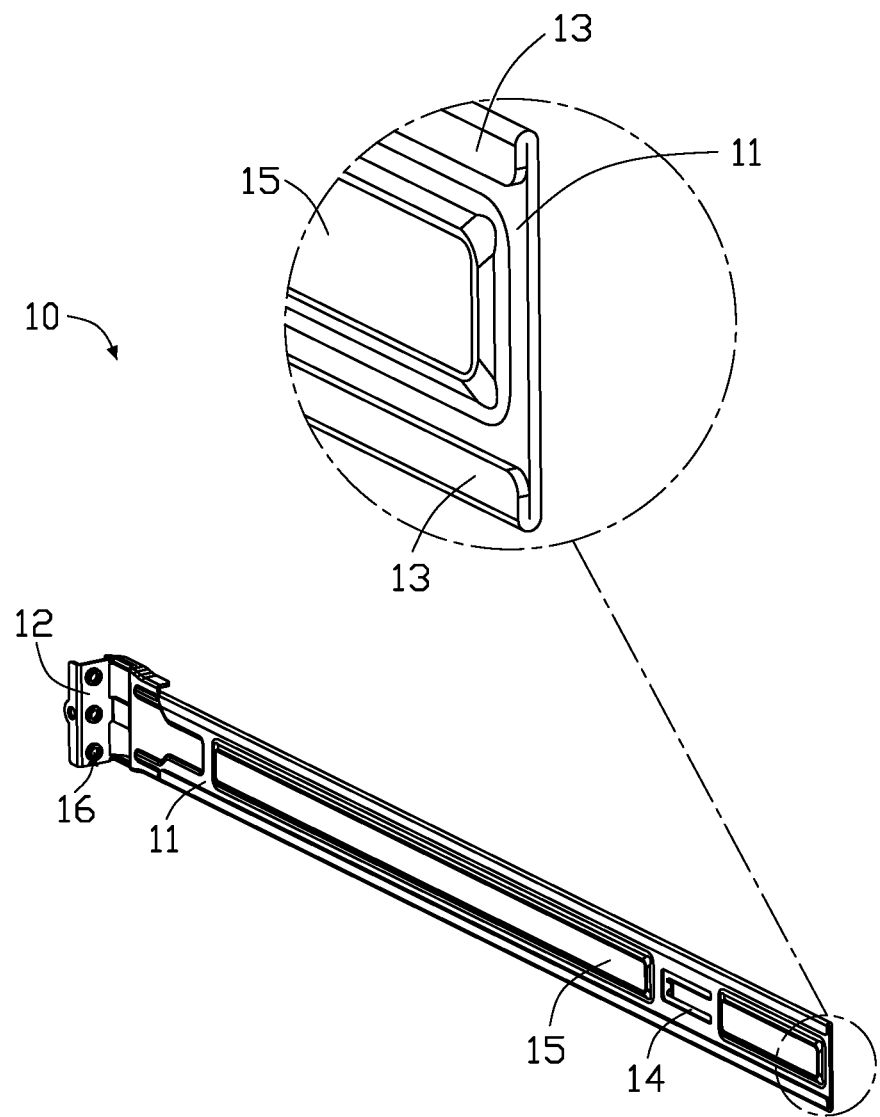
FIG. 3 is an isometric view of a first bracket of the slide rail mechanism.

As shown in FIG. 2 and FIG. 3, the first bracket 10 includes a first body 11. The first fixing portion 12 is located at one end of the first body 11 and extends substantially perpendicularly from the first body 11. The first bracket 10 includes two first bent portions 13. The two first bent portions 13 respectively extend toward each other from two longitudinal sides of the first body 11 and adhere to a surface of the first body 11. The two first bent portions 13 are substantially symmetrical about a longitudinal axis of the first body 11. The first bent portions 13 increase a thickness of the first body 11 at the two longitudinal sides of the first body 11, so that when the first bracket 10 slides along the second bracket 20, the second bracket 20 is not damaged, and a supporting strength of the first bracket 10 on the second bracket 20 is enhanced.

Figure 4:
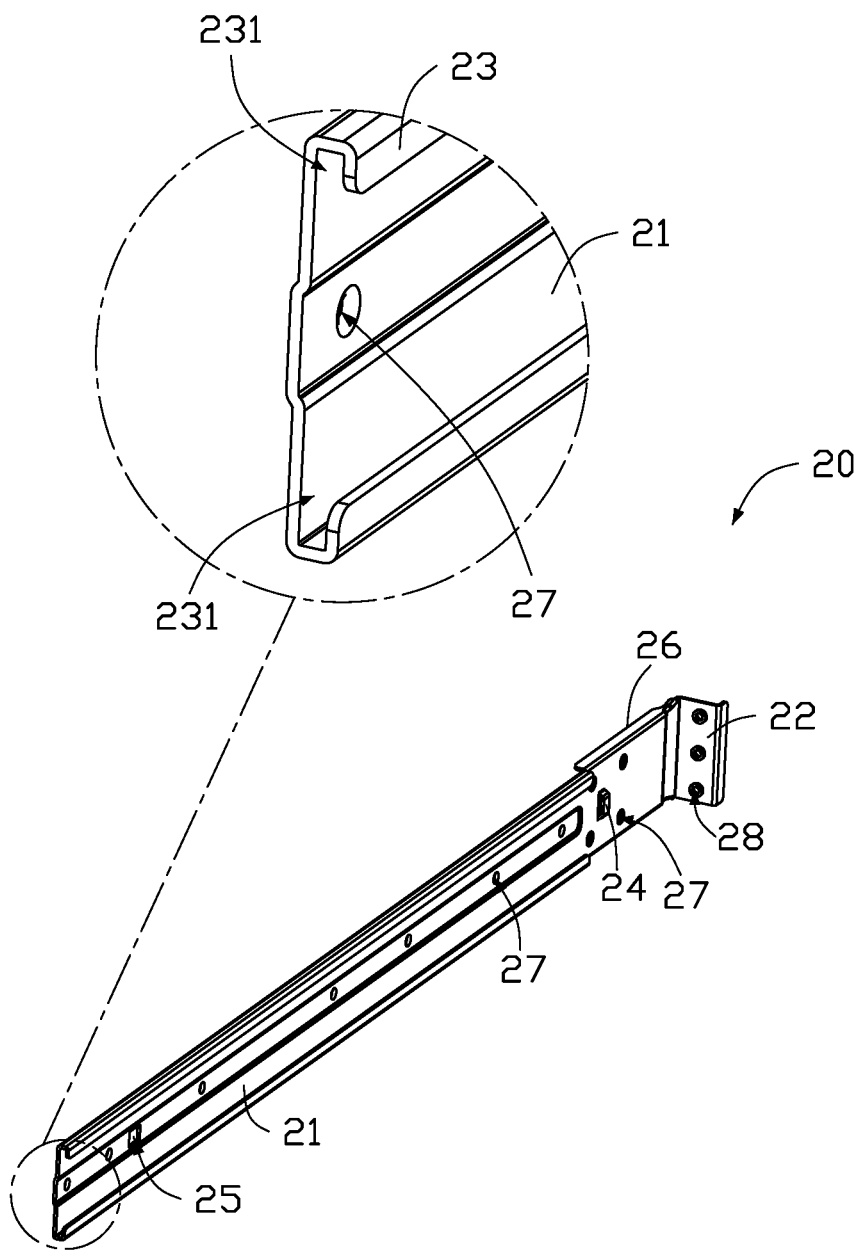
FIG. 4 is an isometric view of a second bracket of the slide rail mechanism.

Referring to FIG. 2 and FIG. 4, the second bracket 20 includes a second body 21. The second fixing portion 22 is located at an end of the second body 21 and extends substantially perpendicularly from the second body 21. When the first bracket 10 is slidably coupled to the second bracket 20, the second fixing portion 22 is located at an end of the first body 11 away from the end of the first body 11 where the first fixing portion 12 is located, and the first fixing portion 12 and the second fixing portion 22 are located on a same side of the second bracket 20.

The second bracket 20 includes two second bent portions 23. The two second bent portions 23 respectively extend toward each other from two longitudinal sides of the second body 21, and the gap 231 is defined between each second bent portion 23 and the second body 21. The two second bent portions 23 are substantially parallel to the second body 21 and are substantially symmetrical about a longitudinal axis of the second body 21. A width of the gap 231 is greater than a sum of a thickness of the first bent portion 13 and the first body 11 to enable the first bent portions 13 and the first body 11 to be received in the gaps 231, so that the first bracket 10 can slide along the second bracket 20 in the gap 231.

In one embodiment, the second bracket 20 includes a blocking portion 24. The blocking portion 24 is a protrusion located on the second body 21 adjacent to the second fixing portion 22. The blocking portion 24 prevents the first bracket 10 from sliding further when the first bracket 10 is fully retracted in the second bracket 20. In other embodiments, the blocking portion 24 can be replaced by a protruding post or other structure having a same function and efficacy. In other embodiments, the blocking portion 24 is omitted, and an end of the second bent portions 23 join together adjacent to the second fixing portion 22 to prevent the first bracket 10 from sliding further when the first bracket 10 is fully retracted.

Figure 5:
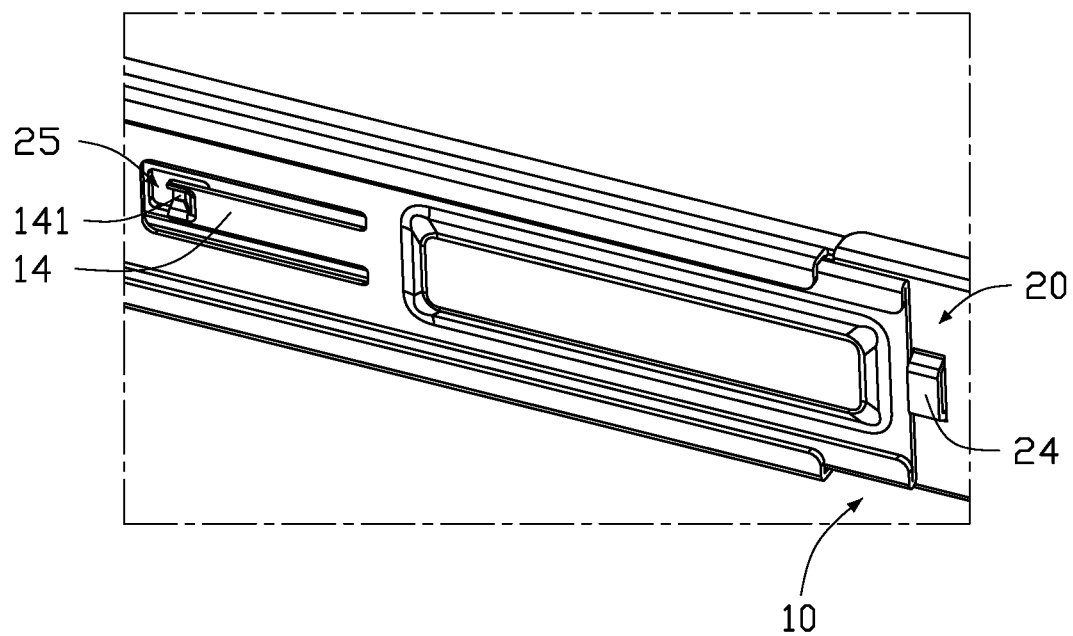
FIG. 5 is a close-up view of a section V in FIG. 1, of the first bracket coupled to the second bracket.

As shown in FIG. 2 and FIG. 5, the first bracket 10 includes a resilient piece 14. The resilient piece 14 is located on the first body 11 adjacent to an end of the first body 11 away from the first fixing portion 12. The resilient piece 14 is substantially parallel to the first body 11. One end of the resilient piece 14 extends from the first body 11, and a second end of the resilient piece 14 is a free end. A side of the free end forms a stamped protrusion 141, such that the stamped protrusion 141 protrudes substantially perpendicularly from a plane of the resilient piece 14 on one side of the resilient piece 14 and is recessed on an opposite side of the resilient piece 14. The second bracket 20 defines a limiting hole 25 adjacent to an end of the second body 21 away from the second fixing portion 22. The stamped protrusion 141 is configured to protrude through the limiting hole 25 to prevent the first bracket 10 from extending further relative to the second bracket 20. The recessed side of the stamped protrusion 141 facilitates the stamped protrusion 141 to protrude through the limiting hole 25. A distance between the end of the second bracket 20 away from the second fixing portion 22 and the limiting hole 25 and a distance between the end of the first bracket 10 and the stamped protrusion 141 is sufficient to prevent the first bracket 10 from disengaging from the second bracket 20. In other embodiments, the resilient piece 14 can be replaced by a telescopic post. In other embodiments, the resilient piece 14 and the limiting hole 25 may be omitted if a depth of the cabinet is less than a sum of a length of the first bracket 10 and a length of the second bracket 20.

As shown in FIG. 2, the first bracket 10 further includes at least one first reinforcing portion 15 protruding from a surface of the first body 11. When the first bracket 10 is slidably coupled to the second bracket 20, the first reinforcing portion 15 extends away from the second bracket 20. The first bracket 10 may include one reinforcing portion 15 or a plurality of reinforcing portions 15 of varying lengths. The first reinforcing portion 15 improves a strength of the first bracket 10. In other embodiments, a plurality of first reinforcing portions 15 having equal lengths may be uniformly spaced on the first body 11.

The second body 21 includes a second reinforcing portion 26. When the first bracket 10 is slidably coupled to the second bracket 20, the second reinforcing portion 26 extends away from the first bracket 10. The first bracket 10 includes a third reinforcing portion 16 extending from the first body 11. The third reinforcing portion 16 is substantially similar to the second reinforcing portion 26 and extends in a same direction as the second reinforcing portion 26. The second reinforcing portion 26 and the third reinforcing portion 16 improve a strength of an end of the first bracket 10 and of the second bracket 20. In other embodiments, when the first bracket 10 and the second bracket 20 have sufficient strength, the first reinforcing portion 15, the second reinforcing portion 26, and the third reinforcing portion 16 may be omitted.

Referring to FIG. 2, the slide rail mechanism 100 further includes a mounting rail 30 mounted to the second bracket 20. The first bracket 10 and the mounting rail 30 are respectively mounted to opposite sides of the second bracket 20.

The mounting rail 30 defines first fixing holes 31, and the second bracket 20 defines second fixing holes 27. When the mounting rail 30 is mounted to the second bracket 20, the second fixing holes 27 correspond to the first fixing holes 31, and fasteners (not shown) are passed through the second fixing holes 27 and the first fixing holes 31 to secure the mounting rail 30 and the second bracket 20 together. The fasteners may be screws, bolts, or the like. In other embodiments, the second bracket 20 and the mounting rail 30 may be secured together by welding or other securing means.

The first bracket 10, the second bracket 20, and the mounting rail 30 may be integrally formed structures made of iron sheets. The first bracket 10 and the second bracket 20 do not define any sliding slots or elongated slots, so that the second bracket 20 can provide sufficient support for the first bracket 10, and the first bracket 10 has sufficient strength to be mounted to the cabinet.

The first fixing portion 12 defines through holes 17, and the second fixing portion 22 defines through holes 28. The first bracket 10 and the second bracket 20 are fixed to the cabinet by screws (not shown) or other fasteners passing through the through holes 17 and the through holes 28. A connection between the first bracket 10 and the second bracket 20 is relatively tight to prevent the first bracket 10 from sliding freely in the second bracket 20.

To install the slide rail mechanism 100 in the cabinet, the first bracket 10 is extended or retracted relative to the second bracket 20 to a suitable length, and then the first fixing portion 12 and the second fixing portion 22 are secured to the cabinet to mount the slide rail mechanism 100 in the cabinet. After the first bracket 10 and the second bracket 20 are fixed in the cabinet, the mounting rail 30 can be mounted to the second bracket 20. In other embodiments, the mounting rail 30 may be first fixed to the second bracket 20 in the cabinet, and then the first bracket 10 and the second bracket 20 are secured in the cabinet.

In summary, a length of the slide rail mechanism 100 can be adjusted to be mounted in cabinets of different sizes. The first bracket 10 and the second bracket 20 do not define any sliding slots or elongated slots for mounting the first bracket 10 to the second bracket 20. The first bracket 10 and the second bracket 20 are mounted together by engagement of the first bent portions 13 and the second bent portions 23, so that the first bracket 10 and the second bracket 20 are strongly coupled together.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A slide rail mechanism comprising:
   a first bracket configured to be mounted to a cabinet;
   a second bracket configured to be mounted to the cabinet, the first bracket being slidably coupled to the second bracket;
   a mounting rail mountable to the second bracket; wherein:
   the mounting rail defines first fixing holes;
   the second bracket defines second fixing holes;
   the first bracket comprises a first fixing portion and first bent portions;
   the second bracket comprises a second fixing portion and second bent portions;
   each of the second bent portions defines a gap;
   the first bent portions are respectively received in the gaps;

the second bent portions limit a sliding direction of the first bracket relative to the second bracket;

the first bracket is retractable or extendable-relative to the second bracket to adjust a combined length of the first bracket and the second bracket such that the first bracket is fixed to the cabinet by the first fixing portion, and the second bracket is fixed to the cabinet by the second fixing portion; and when the mounting rail is mounted to the second bracket, the second fixing holes correspond to the first fixing holes, and the mounting rail and the second bracket are secured together by fasteners passing through the second fixing holes and the first fixing holes.

2. The slide rail mechanism of claim 1, wherein:

the first bracket comprises a first body; and the first bent portions extend toward each other from the first body.

3. The slide rail mechanism of claim 2, wherein:

the first bracket comprises a resilient piece located on the first body;

one end of the resilient piece extends from the first body, and a second end of the resilient piece is a free end;

a side of the second end forms a stamped protrusion, such that the stamped protrusion protrudes perpendicularly from a plane of the resilient piece on one side of the resilient piece and is recessed on an opposite side of the resilient piece;

the second bracket defines a limiting hole;

the stamped protrusion is configured to protrude through the limiting hole to prevent the first bracket from extending further relative to the second bracket when the first bracket is fully extended relative to the second bracket.

4. The slide rail mechanism of claim 3, wherein:

the first bracket comprises a first reinforcing portion protruding from a surface of the first body.

5. The slide rail mechanism of claim 1, wherein:

the second bracket comprises a second body;

the second bent portions extend toward each other from the second body, and the gap is defined between each of the second bent portions and the second body.

6. The slide rail mechanism of claim 5, wherein:

the second body comprises a blocking portion configured to prevent the first bracket from sliding further when the first bracket is fully retracted in the second bracket.

7. The slide rail mechanism of claim 6, wherein:

the mounting rail and the first bracket are respectively mounted to opposite surfaces of the second bracket.

8. A slide rail mechanism comprising:

a first bracket configured to be mounted to a cabinet;

a second bracket configured to be mounted to the cabinet, the first bracket being slidably coupled to the second bracket;

a mounting rail mountable to the second bracket; wherein:

the mounting rail defines first fixing holes;

the second bracket defines second fixing holes:

the second bracket comprises a second body and two second bent portions respectively extending toward each other from two longitudinal sides of the second body;

a gap is defined between each of the two second bent portions and the second body;

the first bracket is slidably received in the gaps;

the second bent portions limit a sliding direction of the first bracket relative to the second bracket;

the first bracket is retractable or extendable-relative to the second bracket to adjust a combined length of the first bracket and the second bracket in the cabinet; and when the mounting rail is mounted to the second bracket, the second fixing holes correspond to the first fixing holes, and the mounting rail and the second bracket are secured together by fasteners passing through the second fixing holes and the first fixing holes.

9. The slide rail mechanism of claim 8, wherein:

the first bracket comprises a first body and two first bent portions;

the two first bent portions respectively extend toward each other from two longitudinal sides of the first body and connect to a surface of the first body; and the two first bent portions are respectively received in the gaps defined by the two second bent portions.

10. The slide rail mechanism of claim 9, wherein:

the first bracket comprises a resilient piece located on the first body;

one end of the resilient piece extends from the first body, and a second end of the resilient piece is a free end;

a side of the second end forms a stamped protrusion, such that the stamped protrusion protrudes perpendicularly from a plane of the resilient piece on one side of the resilient piece and is recessed on an opposite side of the resilient piece;

the second bracket defines a limiting hole;

the stamped protrusion is configured to protrude through the limiting hole to prevent the first bracket from extending further relative to the second bracket when the first bracket is fully extended relative to the second bracket.

11. The slide rail mechanism of claim 10, wherein:

the second body comprises a blocking portion configured to prevent the first bracket from sliding further when the first bracket is fully retracted in the second bracket.

12. The slide rail mechanism of claim 11, wherein:

the mounting rail and the first bracket are respectively mounted to opposite surfaces of the second bracket; and the mounting rail is configured to be mounted to the cabinet.

* * * * *